United States Patent
Mitsumori et al.

(10) Patent No.: US 6,446,358 B1
(45) Date of Patent: Sep. 10, 2002

(54) DRYING NOZZLE AND DRYING DEVICE AND CLEANING DEVICE USING THE SAME

(75) Inventors: Kenichi Mitsumori, Miyagi-ken (JP); Nobuaki Haga, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/616,412

(22) Filed: Jul. 14, 2000

(30) Foreign Application Priority Data

Jul. 16, 1999 (JP) ............................................. 11-203944

(51) Int. Cl.[7] ................................................ F26B 13/00
(52) U.S. Cl. ............................. 34/611; 34/629; 34/623; 34/641; 34/419; 34/422; 34/444; 34/230; 34/232; 34/69
(58) Field of Search ......................... 34/419, 422, 444, 34/448, 459, 464, 69, 629, 623, 611, 641, 643, 230, 232

(56) References Cited

U.S. PATENT DOCUMENTS

| | | | |
|---|---|---|---|
| 5,565,040 A | * 10/1996 | Donian, Jr. et al. | ............ 134/26 |
| 5,871,584 A | 2/1999 | Tateyama et al. | |
| 5,985,041 A | * 11/1999 | Florez | ............................ 134/2 |
| 6,073,369 A | * 6/2000 | Yasuyuki | ...................... 34/651 |
| 6,228,211 B1 | * 5/2001 | Jeong | ........................... 156/345 |
| 6,273,105 B1 | * 8/2001 | Jones | ......................... 134/64 R |

* cited by examiner

Primary Examiner—William C. Doerrler
Assistant Examiner—Mark Shulman
(74) Attorney, Agent, or Firm—Brinks Hofer Gilson & Lione

(57) ABSTRACT

Disclosed is a drying nozzle for realizing a high-efficiency drying device capable of drying an object to be processed to a sufficient degree. The drying nozzle includes a drying gas supply portion having an air supply tube for supplying air for drying a substrate whose surface is wet with a liquid by being sprayed against the surface of the substrate, and a gas/liquid mixture discharge portion which is spaced apart from the surface of the substrate by a predetermined distance to thereby make the thickness of the liquid adhering to the surface of the substrate prior to the drying constant and which has a porous material having a large number of through-holes for discharging the air/liquid mixture consisting of air and the liquid, from the surface of the substrate, the drying gas supply portion and the gas/liquid mixture discharge portion being arranged along the surface of the object so as to be adjacent to each other.

14 Claims, 17 Drawing Sheets

DRYING NOZZLE AND DRYING DEVICE AND CLEANING DEVICE USING THE SAME

BACKGROUND OF THE INVENTION

1. Field of the Invention

The present invention relates to a drying nozzle suitable for use, for example, in drying substrates or the like after a wet processing in a process for manufacturing semiconductor devices, liquid crystal display panels or the like, and a cleaning device equipped with the same.

2. Description of the Related Art

In the field of electronic devices, such as semiconductor devices and liquid crystal display panels, a process for cleaning semiconductor substrates, glass substrates or the like, which are the substrates to be processed, is indispensable. Prior to passing the substrate to the next step after cleaning, it is necessary to dry the substrate. In conventional methods, a drying device is used which has a drying nozzle connected to a supply source of an arbitrary drying gas, such as air, and which is called an air knife, the substrate being dried by blowing air against it from a slit at the forward end of the nozzle.

However, the conventional method of drying substrates has the following problems. When, for example, a substrate of several hundreds mm square is to be dried, the air is spouted out from a slit several mm wide at the forward end of the nozzle at a flow rate of several tens of liters/min·cm. Thus, the air speed is very high, and if air is blown against the surface of a substrate sufficiently wet at such a great speed, a large amount of mist is generated in the drying device, and, in this condition, the interior of the device is stirred up with a great amount of air, resulting in the mist adhering to the substrate again. To reliably prevent the mist from adhering to the substrate again, it is necessary to secure a large space for drying. Further, the amount of air used is rather large. To discharge a great amount of air and to remove the generated mist from the device, the discharge must be effected to a large degree, and a compressor for supplying a large amount of air is needed. The provision of this compressor, however, results in the utility equipment of the drying device being on a large scale. In view of this, there is a demand for a drying device which is of a simple construction and which is capable of effecting drying efficiently.

SUMMARY OF THE INVENTION

The present invention has been made with a view toward solving the above problems. It is an object of the present invention to provide a drying nozzle for realizing a high-efficiency drying device capable of sufficiently drying an object to be processed, a drying device equipped with this drying nozzle, and a cleaning device capable of continuously performing cleaning and drying.

To achieve the above object, there is provided, in accordance with the present invention, a drying nozzle comprising a drying gas supply portion having a gas introduction path for supplying to the surface of an object to be processed a drying gas for drying the object by being sprayed against the object whose surface is wet with a liquid, and a gas/liquid mixture discharge portion which is spaced apart from the surface of the object by a predetermined distance to thereby make the thickness of the liquid adhering to the surface of the object prior to the drying constant and which has a large number of through-holes for discharging the gas/liquid mixture consisting of the drying gas and the liquid from the surface of the object, the drying gas supply portion and the gas/liquid mixture discharge portion being arranged along the surface of the object so as to be adjacent to each other.

In the drying nozzle of the present invention, the drying gas supply portion and the gas/liquid mixture discharge portion are arranged along the surface of the object to be processed so as to be adjacent to each other, and the drying nozzle and the object to be processed are moved relative to each other such that the surface of the object is first opposed to the gas/liquid mixture discharge portion and then to the drying gas supply portion to perform the drying of the object to be processed. First, when the gas/liquid mixture discharge portion, which is spaced apart from the surface of the object to be processed by a predetermined distance, passes over the surface of the object, it is possible to make the thickness of the liquid, which has adhered to the surface of the object to be processed, constant and small. Next, the drying gas is sprayed against the surface of the object to be processed, to which liquid is adhering to a fixed thickness, whereby the liquid is blown together on the gas/liquid mixture discharge portion side, and the portion against which the drying gas is sprayed is dried. And, the gas/liquid mixture consisting of the liquid blown together and the drying gas is discharged from the surface of the object to be processed through the large number of through-holes of the gas/liquid mixture discharge portion. In this way, the entire area of the surface of the object to be processed is dried.

That is, in the drying nozzle of the present invention, the drying gas is not simply sprayed for drying, but in one nozzle, after the spraying of the drying gas from the drying gas supply portion, the gas/liquid mixture is immediately discharged from the gas/liquid mixture discharge portion close by. Further, at the time when the gas is sprayed, the amount of liquid adhering to the surface of the object to be processed is already constant and reduced, so that even if only a small amount of drying gas is sprayed, the drying can be effected to a sufficient degree. In the drying nozzle of the present invention, which has the above function, no liquid mist is generated at the time of spraying the gas as in the case of a conventional drying nozzle, and no mist is directed toward stirring up the interior of the device with a large amount of drying gas, so that the drying of the object to be processed can be reliably effected. Further, the amount of gas/liquid mixture remaining on the surface of the object to be processed is small, so that there is no need to provide a large compressor for air supply or a discharge pump of a great discharge amount, whereby it is possible to reduce the size of the utility equipment of a drying device and achieve an improvement in its efficiency. Further, it is possible for the amount of air supplied to be equal to less than that in the prior art, with the result that the discharge amount is not larger than that in the prior art.

Regarding the gas/liquid mixture discharge portion, it is desirable that at least the portion thereof opposed to the surface of the object to be processed be formed of a hydrophilic material.

In this construction, the gas/liquid mixture existing on the surface of the object to be processed is well in contact with the gas/liquid mixture discharge portion, thereby making it possible to efficiently discharge the gas/liquid mixture. In this specification, the "hydrophilic material" is a material in which the contact angle made by the material surface and the liquid is not larger than 20 degrees. Specific examples of the material of the gas/liquid mixture discharge portion include metal, plastic, and porous materials such as ceramics. In particular, examples of the hydrophilic material include alumina, silicon oxide, and hydrophilic polyethylene.

It is also possible to adopt a construction in which the drying gas supply portion comprises a first member having the gas introduction path, and a second member which is situated nearer to the gas/liquid mixture discharge portion than the first member with respect to the direction along the surface of the object to be processed and which has a large number of through-holes, wherein the drying gas is supplied from both the gas introduction path of the first member and the large number of through-holes of the second member.

In this construction, the drying gas is supplied from both the gas introduction path of the first member and the large number of through-holes of the second member, so that the liquid flows more reliably from the drying gas supply portion side to the gas/liquid mixture discharge portion side, thereby making it possible to effect drying to a sufficient degree.

It is also possible to adopt a construction in which the drying gas supply portion does not simply spray the drying gas against the object to be processed, but it is provided with a gas discharge path for discharging the drying gas sprayed against the object to be processed.

In this construction, the drying gas sprayed against the surface of the object to be processed is immediately discharged from the gas discharge path, and the control of the flowing speed of the drying gas, the direction of the flow, etc. can be easily effected, making it possible to efficiently dry the object to be processed. Furthermore and naturally, a part of the drying gas blown against the surface of the object to be processed serves to reliably prevent the liquid from flowing to the drying air supply portion side due to the difference in pressure as compared with the gas/liquid mixture discharge portion. Thus, it is possible to effect drying to a sufficient degree.

Further, it is also possible to provide the drying air supply portion with a heating means for heating the drying air.

In this construction, the temperature of the drying gas introduced into the nozzle increases, and high-temperature drying gas is sprayed, so that the efficiency in drying can be improved.

In accordance with the present invention, there is provided a drying device comprising the above drying nozzle of the present invention, and a suction means connected to the gas/liquid mixture discharge portion of the drying nozzle and adapted to suck the gas/liquid mixture.

In the drying device of the present invention, the drying nozzle of the present invention is adopted, whereby there is no need to use a large compressor for air supply or a large gas discharge pump; the capacity of the air supply compressor and the gas discharge pump can be reduced to half or less than that of the conventional nozzle, so that it is possible to efficiently perform drying with a relatively simple device structure.

In accordance with the present invention, there is provided a cleaning device comprising a substrate holding means for holding a substrate to be cleaned, a plurality of cleaning nozzles which are arranged side by side opposite to the substrate to be cleaned and which respectively clean the substrate in a plurality of different manners, a relative movement means for cleaning the entire area of the surface of the substrate to be cleaned by relatively moving the substrate holding means and the cleaning nozzles in parallel while maintaining a fixed distance between each of the cleaning nozzles and the substrate to be cleaned, and a drying nozzle according to the present invention which is arranged opposite to the substrate to be cleaned and adapted to dry the substrate to be cleaned.

In the cleaning device of the present invention, a substrate can be cleaned by using a plurality of cleaning nozzles and in a plurality of different manners of cleaning, and then dried by using the drying nozzle of the present invention. That is, it is possible to realize a cleaning device in which it is possible to continuously perform cleaning in a plurality of manners and drying with a single device, the cleaning device being suitable for use in a manufacturing process for semiconductor devices, liquid crystal display panels, etc.

DESCRIPTION OF THE PREFERRED EMBODIMENTS

First Embodiment

The first embodiment of the present invention will now be described with reference to FIGS. 1 and 2.

Figure 1:
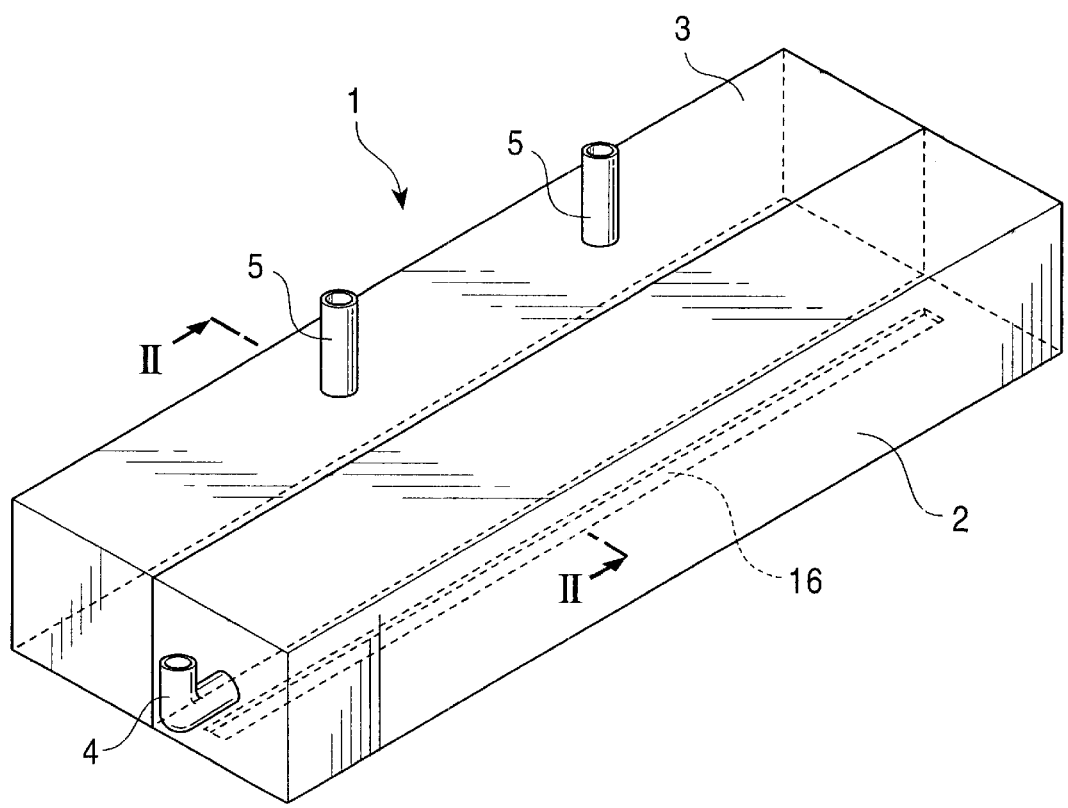
FIG. 1 is a perspective view of a drying nozzle according to a first embodiment of the present invention.
Figure 2:
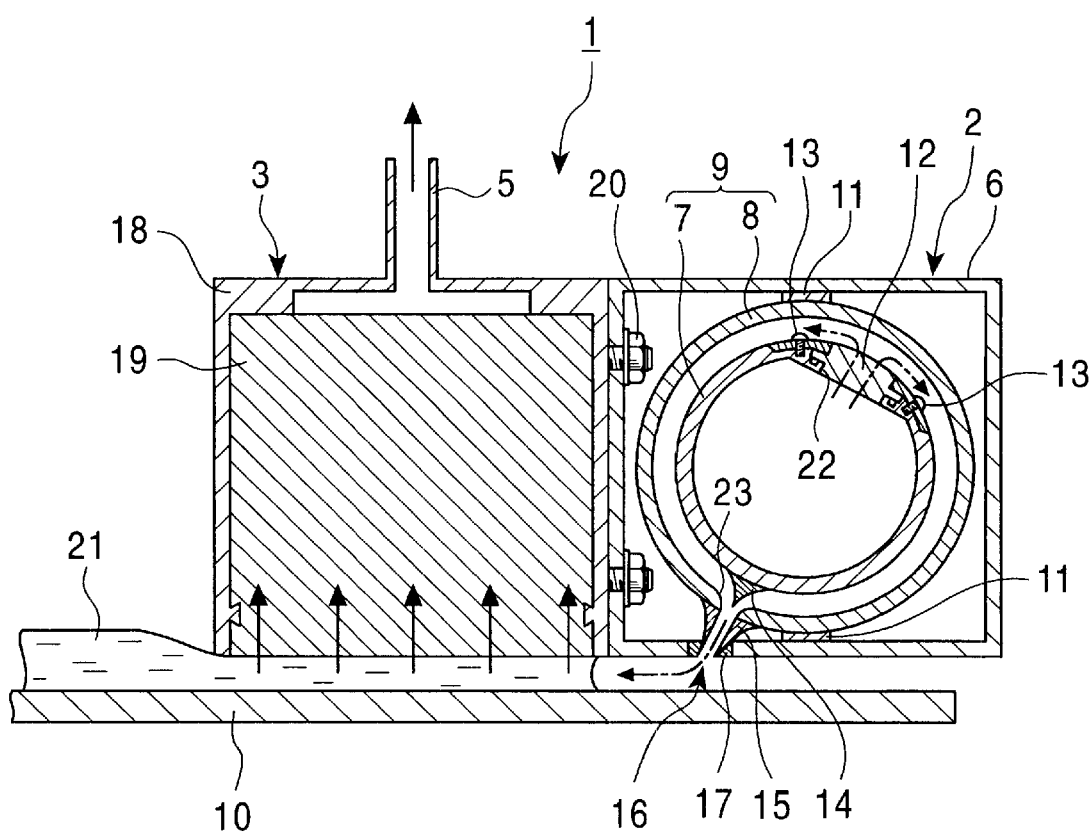
FIG. 2 is a sectional view taken along the line II—II of FIG. 1.

FIG. 1 is a perspective view of the drying nozzle of this embodiment, and FIG. 2 is a sectional view taken along the line II—II of FIG. 1. The drying nozzle of this embodiment is used, for example, to dry solely the surface of a rectangular glass substrate (object to be processed).

As shown in FIG. 1, the drying nozzle 1 of this embodiment comprises a drying gas supply portion 2 and a gas/liquid mixture discharge portion 3 which are both in the form of thin and narrow boxes and which are arranged along the surface of a substrate so as to be adjacent to each other. The drying gas supply portion 2 serves to spray air (drying gas) toward the surface of the substrate, and the gas/liquid mixture discharge portion 3 is spaced apart from the surface of the substrate by a predetermined distance to thereby make the thickness of the liquid on the surface of the substrate before drying constant and has a large number of through-holes for discharging from the surface of the substrate a gas/liquid mixture consisting of air and liquid. At one longitudinal end surface of the drying gas supply portion 2, there is provided an air supply inlet 4, and, on the upper surface of the gas/liquid mixture discharge portion 3, there are provided two gas/liquid mixture discharge outlets 5. When the drying nozzle 1 is used, an arbitrary air supply source in, for example, a production line, is connected to the air supply inlet 4, and arbitrary suction means such as a pump having liquid discharging and gas discharging function is connected to the gas/liquid mixture discharge outlets 5.

As shown in FIG. 2, the drying gas supply portion 2 has a box-like casing 6, which accommodates an air supply tube 9 (gas introduction path) consisting of a double tube comprising an inner tube 7 and an outer tube 8. The inner surface and outer surface of the inner tube 7 and the outer tube 8 constituting the air supply tube 9 are polished so that no dust may be emitted from these tubes. Due to this arrangement, no dust or the like is contained in the air sprayed against the substrate 10, and contamination of the substrate 10 is prevented. In an example, stainless steel (SUS 316L) is used for the inner tube 7 and the outer tube 8 constituting the air supply tube 9, and GEP-W processing (Kobe Steel Pantech, Co) is performed on the surface. And, the air supply tube 9 is secured to the casing 6 at upper and lower securing portions 11 by soldering or the like.

In a part of the inner tube 7, there is provided an opening 22, and an air-uniform-supply resistor member 12 is incorporated in this opening 22 and secured to the inner tube 7 by securing means such as a screw 13. The air-uniform-supply resistor member 12 is formed of a material through which air can be transmitted so that air introduced into the inner tube 7 from one end of the air supply tube 9 may be uniformly released into the space between the inner tube 7 and the outer tube 8. Further, when air is transmitted, it offers a certain degree of resistance. That is, since there is a certain degree of resistance when air is transmitted through the air-uniform-supply resistor member 12, if air is supplied solely from one end of the air supply tube 9 into the inner tube 7, the air flows into the space between the inner tube 7 and the outer tube 8 through the air-uniform-supply resistor member 12 after being uniformly diffused in the inner tube 7, and air is uniformly ejected from any longitudinal position of the drying gas supply portion 2. The air-uniform-supply resistor member 12 is formed, for example, of a material such as porous ceramic. However, it is also possible to use a well-known filter material.

Further, an air flow direction control portion 14 protruding substantially in the form of a triangle is secured by soldering or the like to the outer surface of the inner tube 7 at a position substantially on the opposite side of the mounting position of the air-uniform-supply resistor member 12, and an opening 23 is formed on the outer tube 8 at a position corresponding to the mounting position of the air flow direction control portion 14, a nozzle portion 15 for spraying air being secured to the opening 23 by soldering or the like, with its forward end being directed to the gas/liquid mixture discharge portion 3. it is desirable that the inclination of the nozzle portion 15 be such that the angle it makes with the normal of the surface of the substrate 10 is approximately 5 to 30 degrees. And, as shown in FIG. 1, an air spraying slit 16 extending longitudinally is formed in the lower surface of the casing 6, and the forward end of the nozzle portion 15 is positioned in the air spraying slit 16, the gap between the forward end of the nozzle portion 15 and the air spraying slit 16 of the casing 6 being sealed by a sealing portion 17. Due to this construction, the air supplied into the inner tube 7 passes through the air-uniform-supply resistor member 12, and flows out into the space between the inner tube 7 and the outer tube 8, flows circumferentially in this space, is guided to the nozzle portion 15 due to the configuration of the air flow direction control portion 14 before it is sprayed against the substrate 10 from the forward end of the nozzle portion 15, that is, from the air spraying slit 16 of the lower surface of the drying gas supply portion 2 (The air flow is indicated by a dashed-line arrow in FIG. 2).

As shown in FIG. 2, the gas/liquid mixture discharge portion 3 comprises a box-like casing 18, which accommodates a porous material 19 having a large number of through-holes. The porous material 19 is formed, for example, of metal, plastic or ceramic. It is desirable that at least the portion thereof opposed to the substrate 10 be formed of a hydrophilic material. In this case, the gas/liquid mixture on the surface of the substrate 10 is well in contact with the porous material 19, and the gas/liquid mixture can be discharged efficiently. Further, it is desirable that the surface of the porous material 19 opposed to the substrate 10 exhibit little surface irregularity and little waviness. When this drying nozzle 1 is used, a suction means such as a pump is connected to the gas/liquid mixture discharge outlets 5 provided on the upper surface of the casing 18, and the gas/liquid mixture on the substrate 10 is discharged from the gas/liquid mixture outlets 5 through the large number of through-holes of the porous material 19. (The flow of the gas/liquid mixture is indicated by al solid line arrow in FIG. 2). Further, the casings 6 and 18 of the drying gas supply portion 2 and the gas/liquid mixture discharge portion 3 are secured to each other by screws 20.

In the drying nozzle 1, constructed as described above, the drying gas supply portion 2 and the gas/liquid mixture discharge portion 3 are arranged side by side so as to be adjacent to each other along the surface of the substrate 10. When it is used, the drying nozzle 1 and the substrate 10 are moved relative to each other to dry the substrate 10 such that the surface of the substrate 10 is first opposed to the gas/liquid mixture discharge portion 3 and then the drying gas supply portion 2 is opposed thereto (i.e., the substrate 10 is moved from the left to the right in FIG. 2). First, when the gas/liquid mixture discharge portion 3, which is arranged above the substrate surface at a minute distance, passes, the liquid 21, which has been adhering to the surface of the substrate 10 so as to swell thereon, is pushed away, and the thickness of the liquid becomes constant and small. Next, air is sprayed from the air spraying slit 16 of the drying gas supply portion 2 toward the surface of the substrate 10 to which the liquid 21 adheres in a fixed thickness, whereby the liquid 21 is blown together on the gas/liquid mixture discharge portion 3 side, and the portion of the substrate 10 against,which air is sprayed is dried. And, the gas/liquid mixture consisting of the liquid blown together under the gas/liquid mixture discharge portion 3 and air is sucked from the surface of the substrate 10 through the large number of through-holes of the porous material 19 and discharged. In this way, the total area of the surface of the substrate 10 can be dried.

In the drying nozzle 1 of this embodiment, the gas/liquid mixture is directly discharged from the gas/liquid mixture discharge portion 3 while spraying air from the drying gas supply portion 2. Further, at the time when the air is sprayed, the amount of liquid 21 adhering to the surface of the substrate 10 is already constant and reduced, so that if the air is sprayed in a smaller amount as compared to the prior art, drying can be effected to a sufficient degree. Thus, in the drying nozzle 1 of this embodiment, no mist is generated at the time of air spraying as in the case of the conventional drying nozzle, and the drying of the substrate can be reliably effected. Further, the amount of gas/liquid mixture remaining on the surface of the substrate is small, so that there is no need to provide a pump of a large displacement or a compressor for air supply, thereby the efficiency of the drying device as a whole can be improved.

Second Embodiment

The second embodiment of the present invention will now be described with reference to FIGS. 3 and 4.

Figure 3:
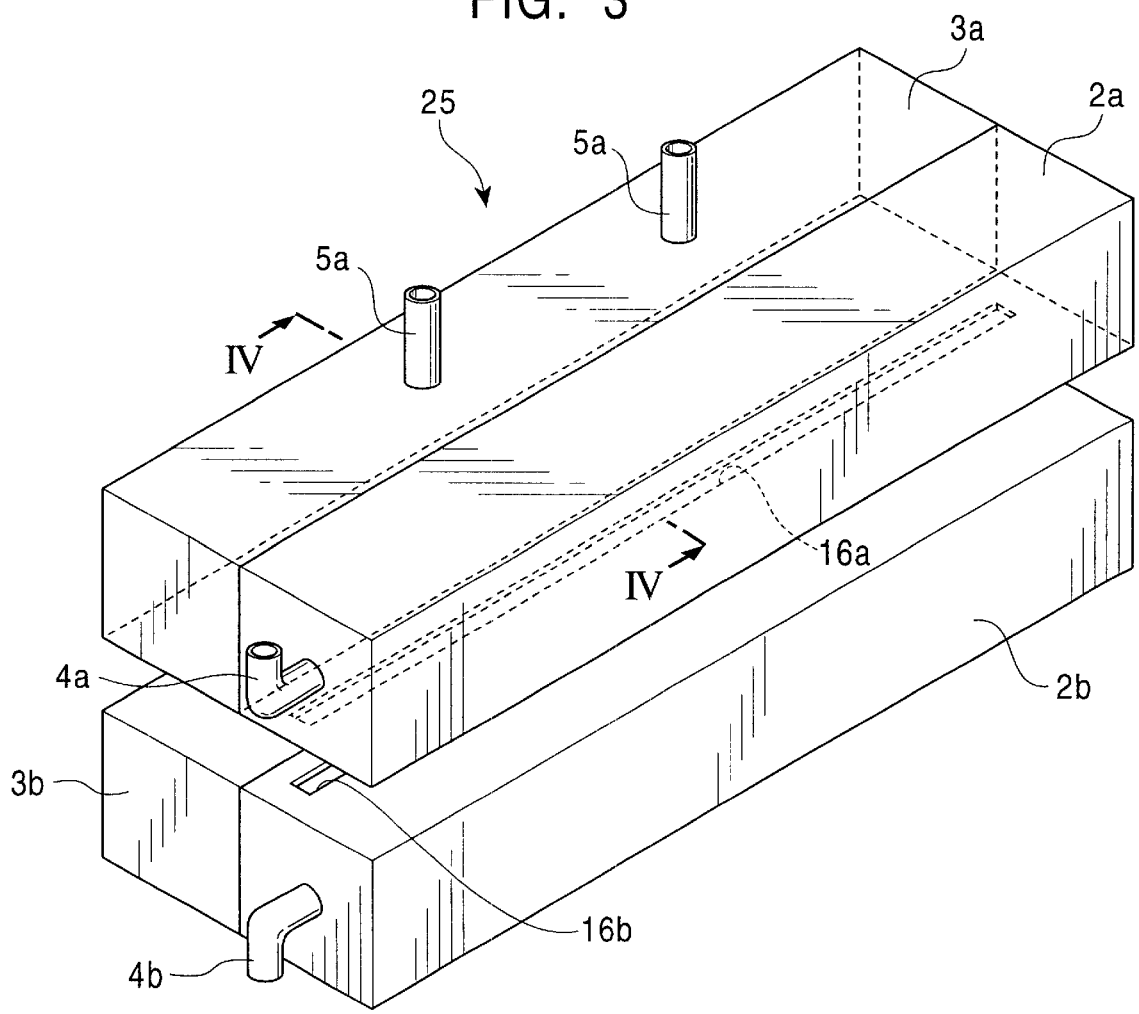
FIG. 3 is a perspective view of a drying nozzle according to a second embodiment of the present invention.
Figure 4:
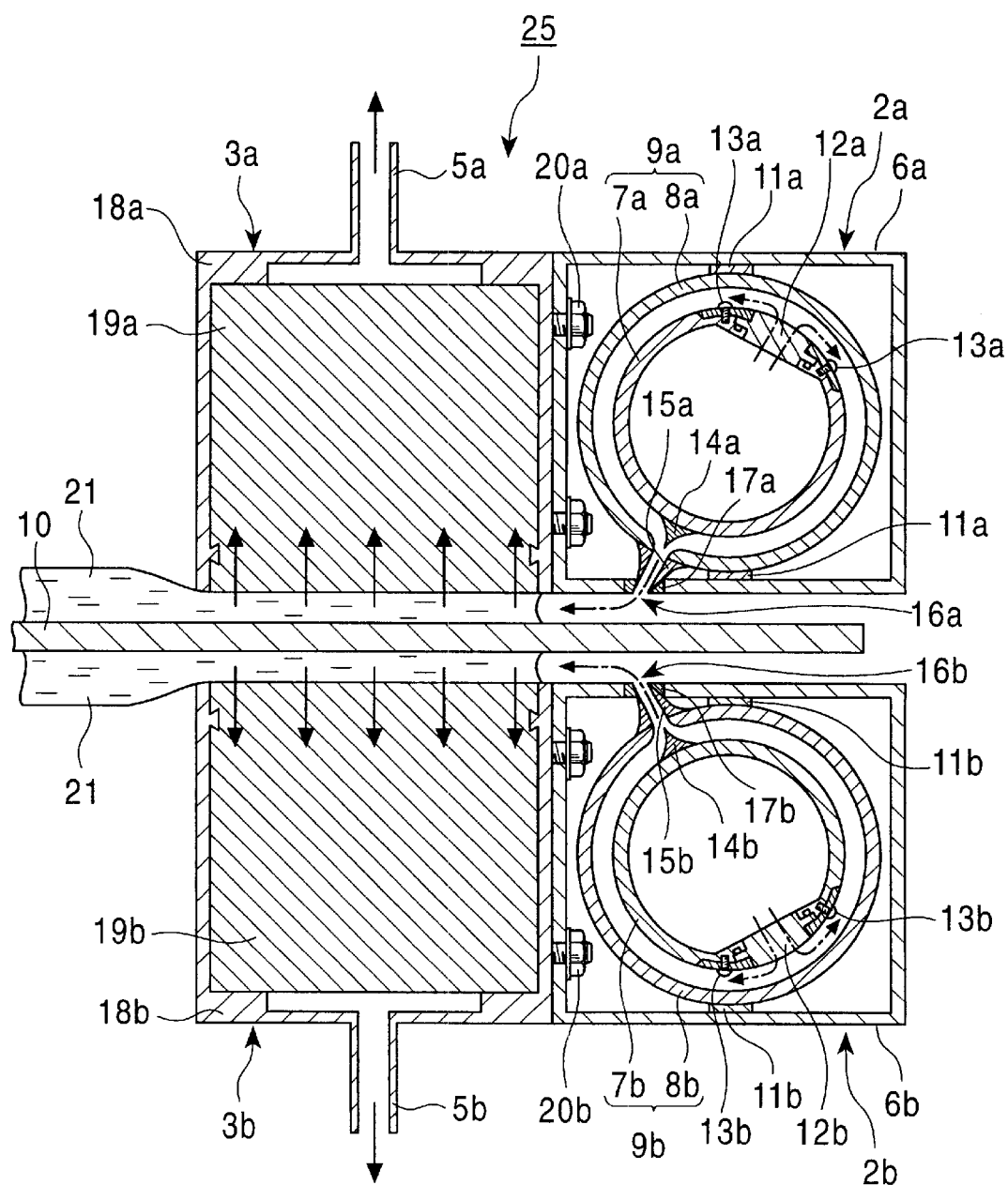
FIG. 4 is a sectional view taken along the line IV—IV of FIG. 3.

FIG. 3 is a perspective view showing the drying nozzle of this embodiment, and FIG. 4 is a sectional view taken along the line IV—IV of FIG. 3. While the drying nozzle of the first embodiment only dries the obverse surface of a substrate, the drying nozzle of this embodiment is capable of simultaneously drying both the obverse and reverse surfaces of a substrate.

As shown in FIGS. 3 and 4, the drying nozzle 25 of this embodiment consists of drying nozzles according to the first embodiment arranged in vertical symmetry. The construction of each drying nozzle is completely the same as that of the drying nozzle of the first embodiment. Thus, in FIGS. 3 and 4, the components which are common to FIGS. 1 and 2 are indicated by the same reference numerals with the character "a" added thereto for the upper nozzle and the character "b" added thereto for the lower nozzle, and a description of such components will be omitted. It is possible for the upper and lower nozzles to move independently as separate units or be connected in an arbitrary way so as to move together.

In the drying nozzle 25 of this embodiment, it is possible to simultaneously dry both the obverse and reverse sides of the substrate 10, so that it is suitable for use as a drying means when applied, for example, to a cleaning device capable of cleaning both sides of a substrate, or to a case in which the reverse side also becomes wet to some degree when only the obverse side of a substrate is cleaned. Further, when upper and lower nozzles are provided, the amount of mist generation, the exhaust capacity of the pump, the air compressor, etc. increase as compared to the case in which only one nozzle is provided. In the drying nozzle 25 of this embodiment, however, this problem can be avoided.

Third Embodiment

The third embodiment of the present invention will now be described with reference to FIGS. 5 and 6.

Figure 5:
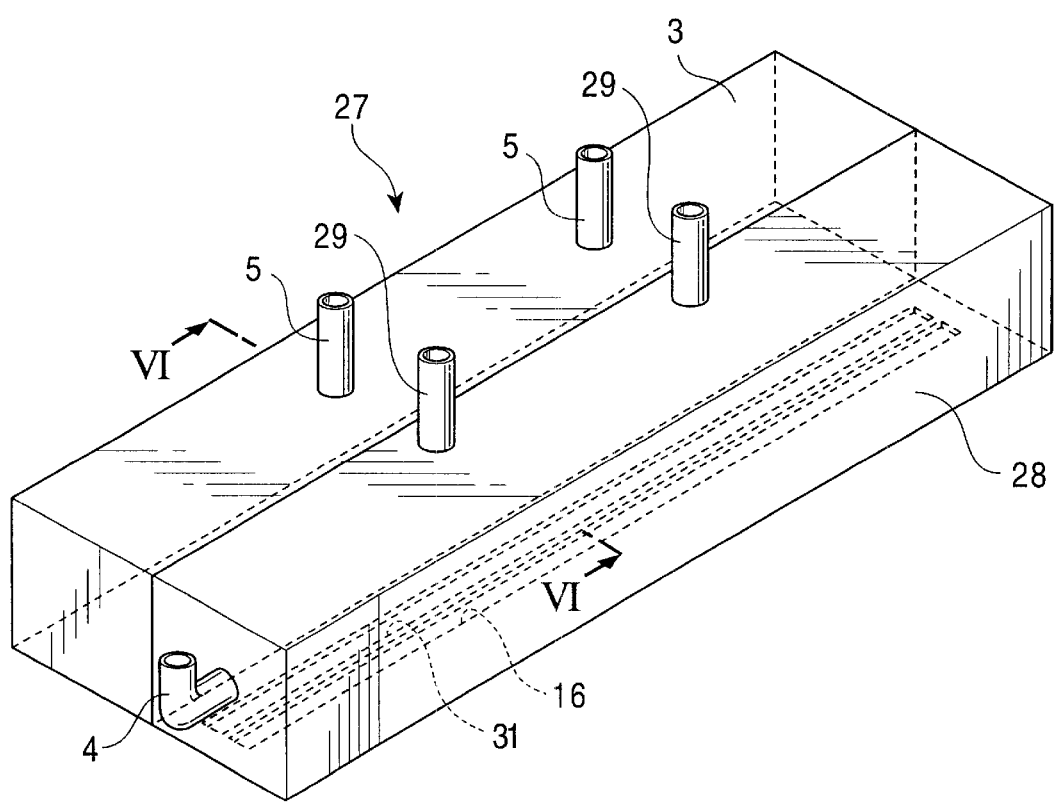
FIG. 5 is a perspective view of a drying nozzle according to a third embodiment of the present invention.
Figure 6:
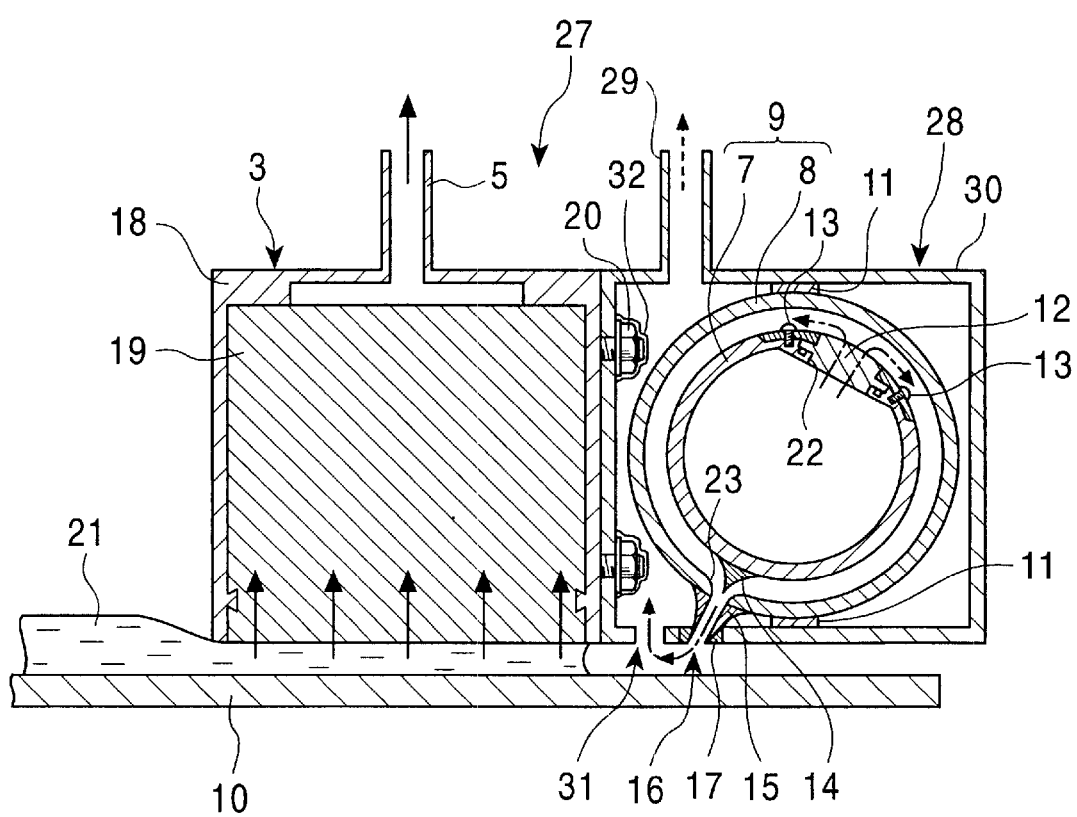
FIG. 6 is a sectional view taken along the line VI—VI of FIG. 5.

FIG. 5 is a perspective view of the drying nozzle of this embodiment, and FIG. 6 is a sectional view taken along the line VI—VI of FIG. 5. In the drying nozzle of this embodiment, a gas discharge path is further added to the drying gas supply portion of the drying nozzle of the first embodiment. Thus, in FIGS. 5 and 6, the components which are common to those of the FIGS. 1 and 2 are indicated by the same reference numerals, and a detailed description of such components will be omitted.

As shown in FIG. 5, in the drying nozzle 27 of this embodiment, as in the first embodiment, the drying gas supply portion 28 and the gas/liquid mixture discharge portion 3 are arranged side by side along the surface of the substrate so as to be adjacent to each other. However, while in the first embodiment the air supply inlet 4 is provided in the drying gas supply portion 2 and the gas/liquid mixture discharge outlets 5 are provided in the gas/liquid mixture discharge portion 3, in this embodiment, the drying gas supply portion 28 is provided with air discharge outlets 29 in addition to the air supply inlet 4. That is, the air supply inlet 4 is provided at one longitudinal end surface of the drying gas supply portion 28, and two air discharge outlets 29 are provided on the top surface thereof, and two gas/liquid mixture discharge outlets 5 are provided on the top surface of the gas/liquid mixture discharge portion 3.

As shown in FIG. 6, the drying gas supply portion 28 includes a casing 30, which accommodates an air supply tube 9 (gas introduction path) similar to that of the first embodiment. As in the first embodiment, the air-uniform-supply resistor member 12 is secured to the opening 22 of the inner tube 7, and the air flow direction control portion 14 is secured to the outer surface, the nozzle portion 15 being secured to the opening 23 of the outer tube 8. However, this embodiment differs from the first embodiment in that, as shown in FIG. 5, an air discharge slit 31 (gas discharge path) extending longitudinally like the air spraying slit 16 is formed at a position nearer to the gas/liquid mixture discharge portion 3 than the air spraying slit 16 in the lower surface of the casing 30, and air discharge outlets 29 are provided on the top surface of the casing 30. The construction of the gas/liquid mixture discharge portion 3 is completely the same as that of the first embodiment.

When the drying nozzle 27 of this embodiment is used, an arbitrary exhaust pump or the like is connected to the air discharge outlets 29. And, as in the nozzle of the first embodiment, the air flows through the inner space of the inner tube 7, the interior of the air-uniform-supply resistor member 12, the space between the inner tube 7 and the outer tube 8, the nozzle portion 15, and the air spraying slit 16 before it is sprayed onto the substrate. It differs from the first embodiment in that the air sprayed onto the substrate 10 is sucked immediately by the adjacent air discharge slit 31, and passes through the inner space of the casing 30 of the drying gas supply portion 28 before it is discharged from the air discharge outlets 29. However, not the total amount of air sprayed onto the substrate 10 is sucked through the air discharge slit 31, and some of it naturally flows to the gas/liquid mixture discharge portion 3 side, so that it is a mixture of air and liquid that is discharged from the gas/liquid mixture discharge portions 5.

Further, in this embodiment, the screws 20 securing the drying gas supply portion 28 and the gas/liquid mixture discharge portion 3 to each other are sealed by covers 32, whereby dust is prevented from being emitted from the screwed portions, thereby preventing contamination of the substrate by dust.

In this construction, the air sprayed onto the surface of the substrate is immediately discharged through the air discharge slit 31, and the control of the flow speed of the drying gas, the flow direction thereof, etc. can be easily effected, making it possible to efficiently dry the substrate. Further, a part of the air hitting the surface of the substrate when discharging the gas is reliably prevented from flowing to the drying gas supply portion 28 side due to the difference in pressure between it and the gas/liquid mixture discharge portion 3. As a result, drying can be effected to a sufficient degree.

Fourth Embodiment

The fourth embodiment of the present invention will now be described with reference to FIGS. 7 and 8.

Figure 7:
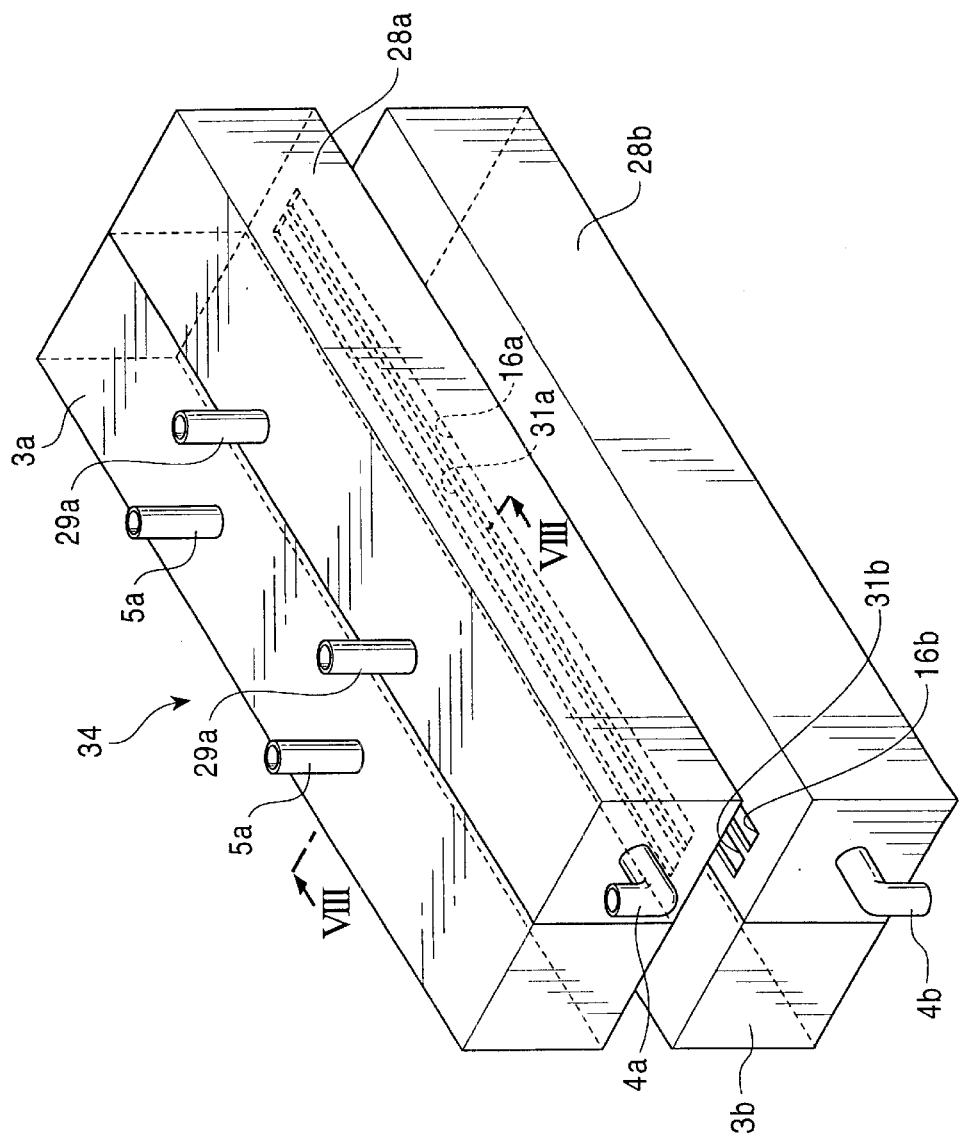
FIG. 7 is a perspective view of a drying nozzle according to a fourth embodiment of the present invention.
Figure 8:
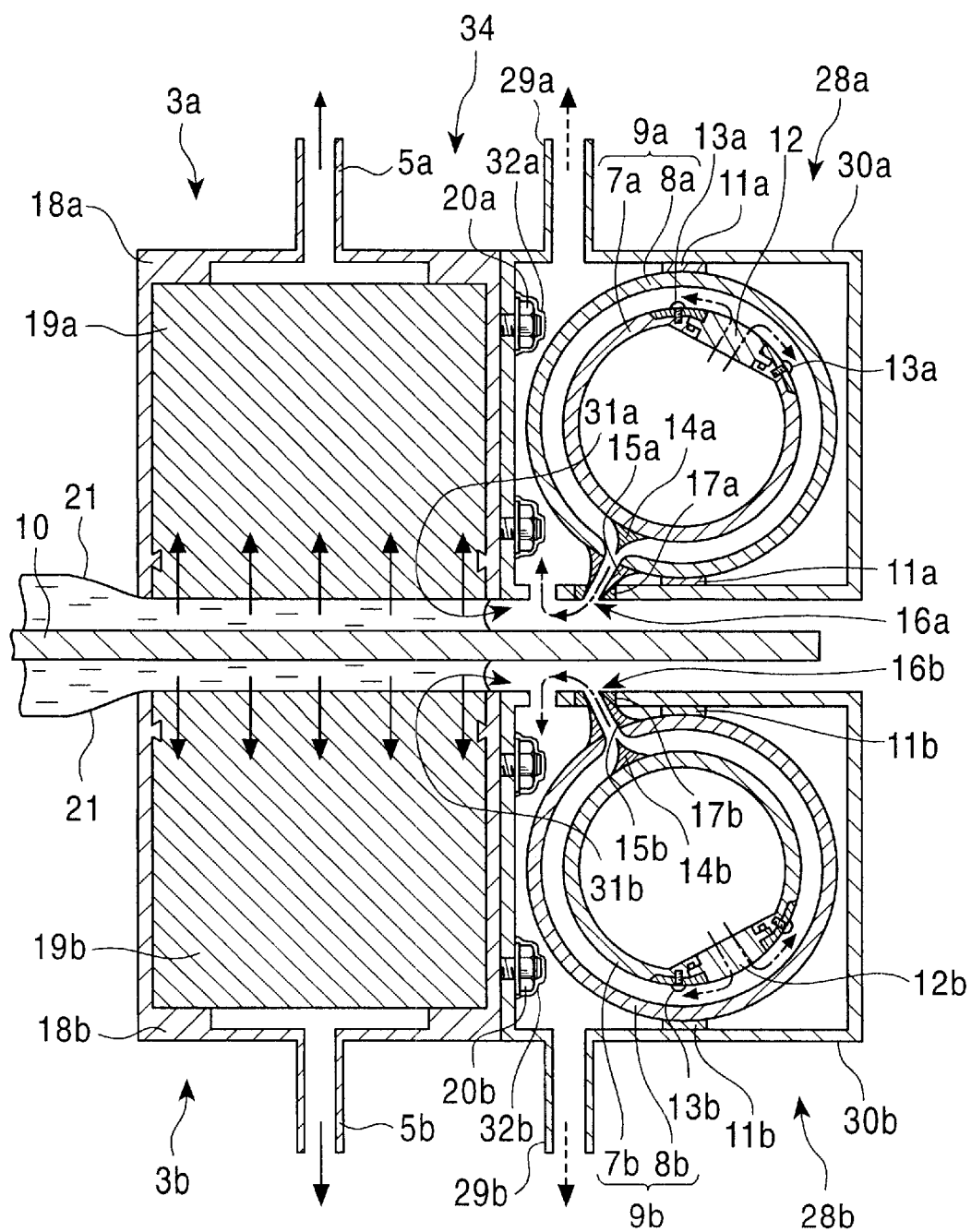
FIG. 8 is a sectional view taken along the line VIII—VIII of FIG. 7.

FIG. 7 is a perspective view showing the drying nozzle of this embodiment, and FIG. 8 is a sectional view taken along the line VIII—VIII of FIG. 7. While the drying nozzle of the third embodiment only dries the obverse surface of a substrate, the drying nozzle of this embodiment simultaneously dries both the obverse and reverse surfaces of a substrate.

As shown in FIGS. 7 and 8, the drying nozzle 34 of this embodiment consists of drying nozzles 27 according to the third embodiment arranged in vertical symmetry, and the construction of each component nozzle is completely the same as that of the drying nozzle 27 of the third embodiment. Thus, in FIGS. 7 and 8, the components which are common to those of FIGS. 5 and 6 are indicated by the same reference numerals with the affix "a" added thereto for the upper nozzle and the affix "b" added thereto for the lower nozzle, and a description of such components will be omitted. It is possible for the upper and lower nozzles to move independently as separate units or be connected in an arbitrary way so as to move together.

Fifth Embodiment

The fifth embodiment of the present invention will now be described with reference to FIGS. 9 and 10.

Figure 9:
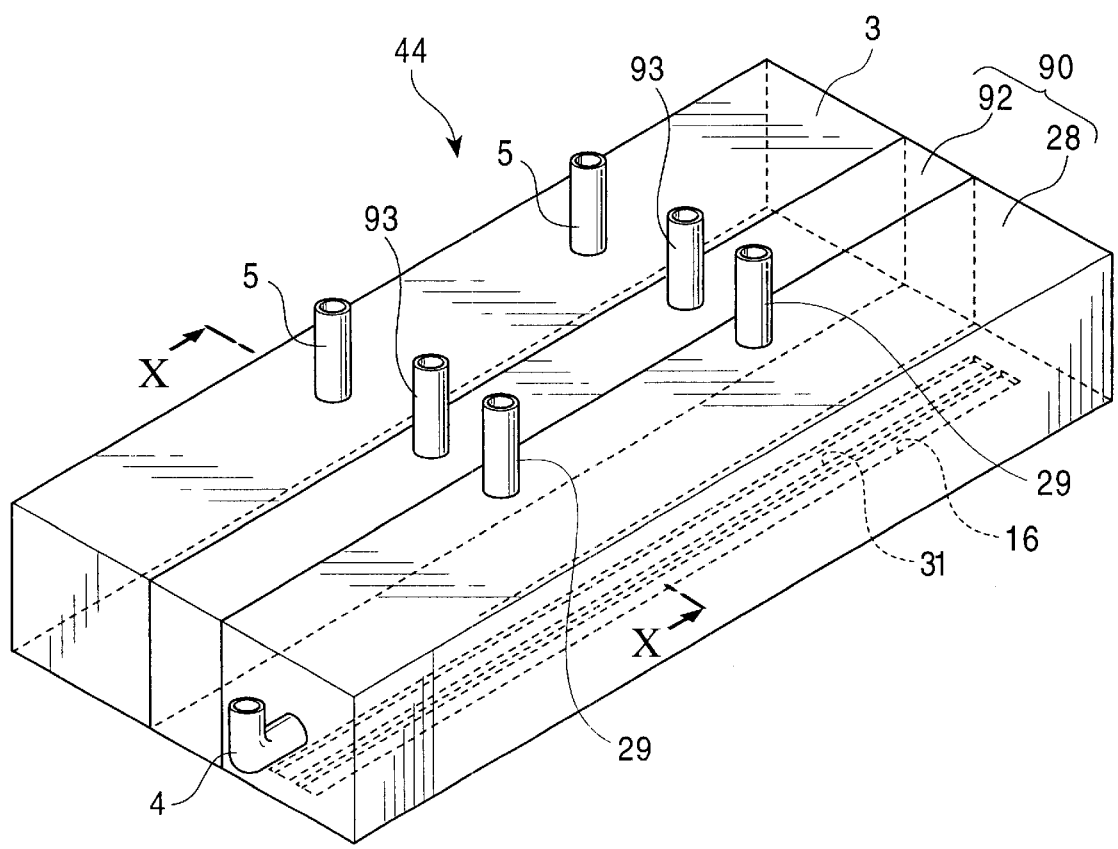
FIG. 9 is a perspective view of a drying nozzle according to a fifth embodiment of the present invention.
Figure 10:
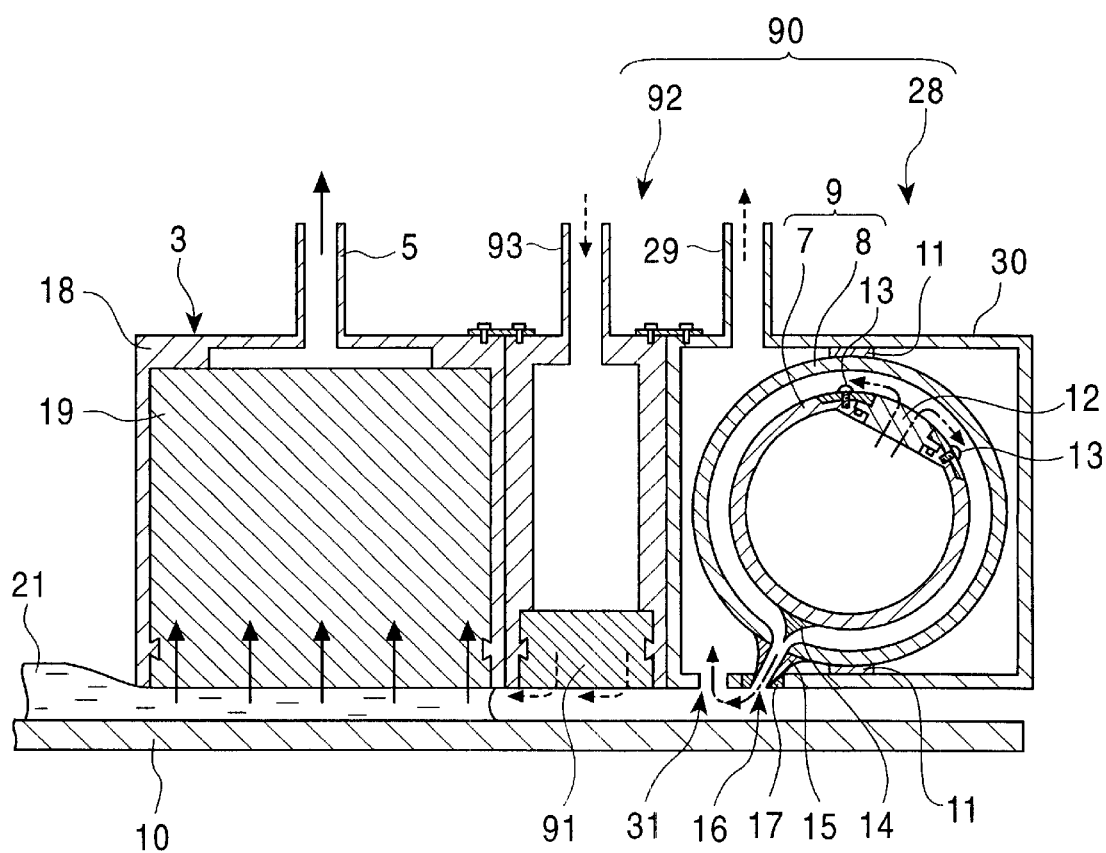
FIG. 10 is a sectional view taken along the line X—X of FIG. 9.

FIG. 9 is a perspective view showing the drying nozzle of this embodiment, and FIG. 10 is a sectional view taken along the line X—X of FIG. 9. In the drying nozzle of this embodiment, a porous material for air supply is further added to the drying gas supply portion of the drying nozzle of the third embodiment, to which a gas discharge path is added. Thus, in FIGS. 9 and 10, the components which are common to those of FIGS. 5 and 6 are indicated by the same reference numerals and a detailed description of such components will be omitted.

As shown in FIGS. 9 and 10, in the drying nozzle 44 of this embodiment, the drying gas supply portion 90 comprises a first member 28 having the air supply tube 9 like the third embodiment and a second member 92 which is provided on the gas/liquid mixture discharge portion 3 side and which includes a porous material 91 having a large number of through-holes. And, air is supplied through the air supply inlet 4 of the first member 28 and air supply inlets 93 of the second member 92, and air is sprayed onto the surface of the substrate 10 from both the air spraying slit 16 provided on the lower side of the casing on the first member 28 side and the large number of through-holes of the porous material 91 of the second member 92.

In the drying nozzle 44 of this embodiment, air is supplied from both the air spraying slit 16 of the first member 28 and the large number of through-holes of the second member 92, so that liquid flows more reliably on the substrate 10 from the drying gas supply portion 90 side to the gas/liquid mixture discharge portion 3 side, thereby making it possible to effect drying to a sufficient degree.

Sixth Embodiment

The sixth embodiment of the present invention will now be described with reference to FIGS. 11 and 12.

Figure 11:
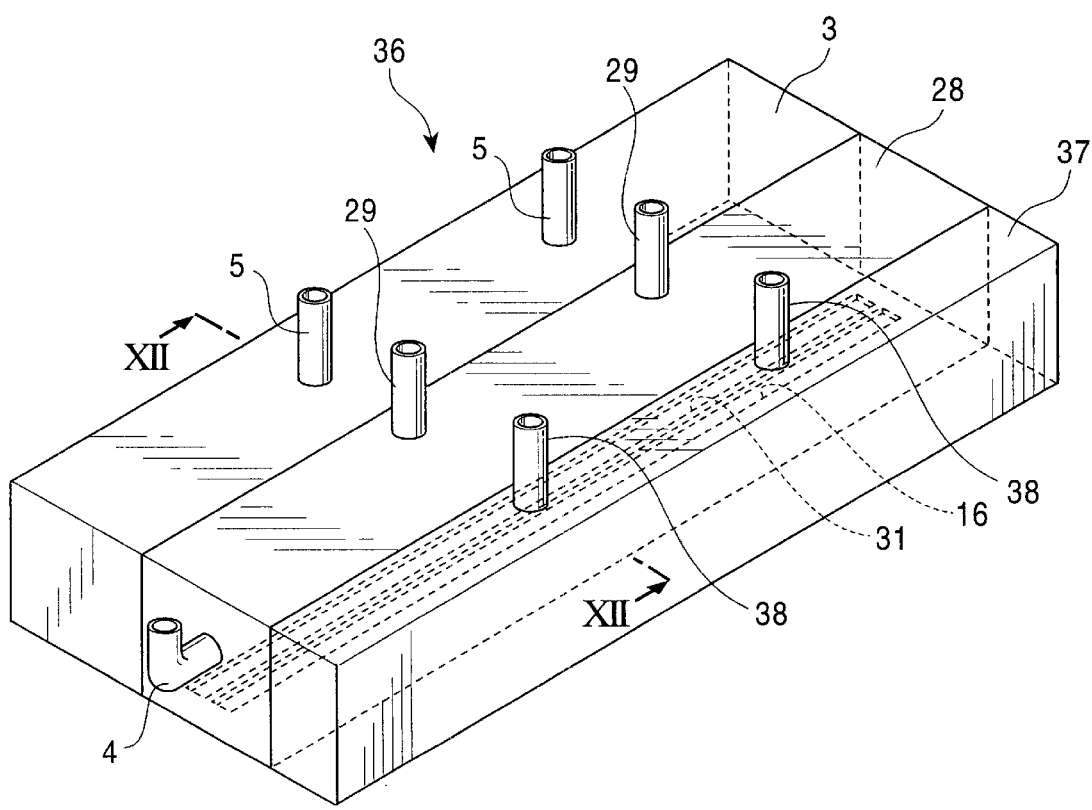
FIG. 11 is a perspective view of a drying nozzle according to a sixth embodiment of the present invention.
Figure 12:
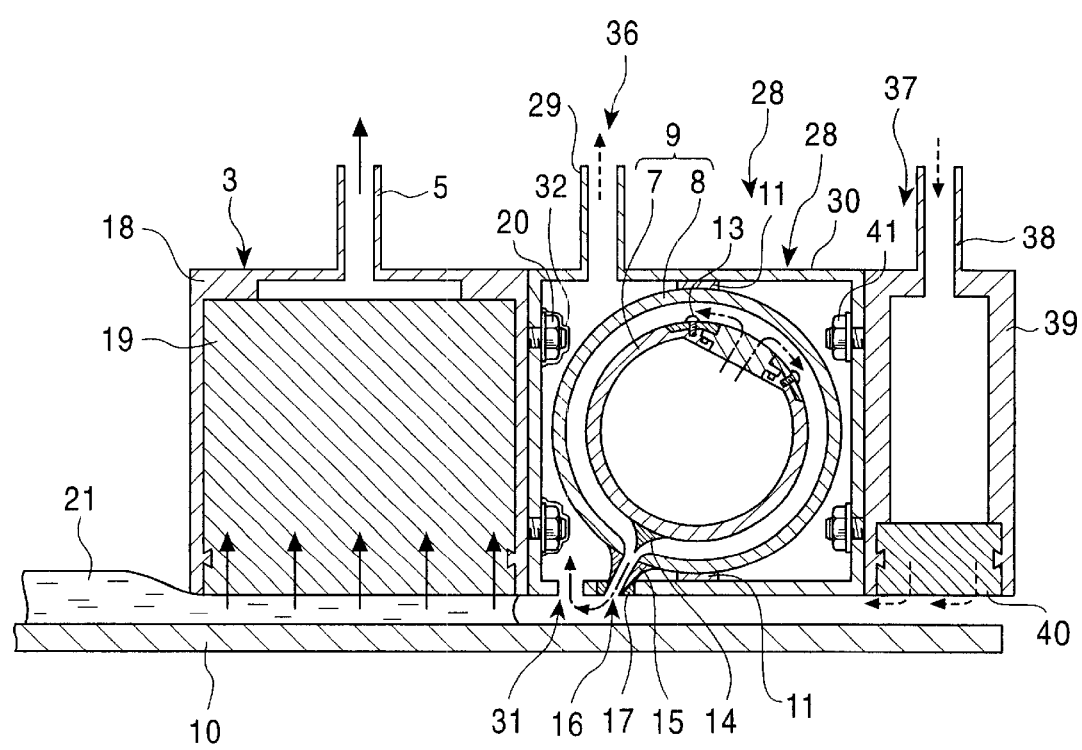
FIG. 12 is a sectional view taken along the line XII—XII of FIG. 11.

FIG. 11 is a perspective view showing the drying nozzle of this embodiment, and FIG. 12 is a sectional view taken along the line XII—XII of FIG. 11. In the drying nozzle of this embodiment, an air curtain forming portion is further added to the drying nozzle of the third embodiment, in which a gas discharge path is added to the drying gas supply portion. Thus, in FIGS. 11 and 12, the components which are common to those of FIGS. 5 and 6 are indicated by the same reference numerals, and a detailed description of such components will be omitted.

As shown in FIG. 11, as in the third embodiment, in the drying nozzle 36 of this embodiment, the drying gas supply portion 28 and the gas/liquid mixture discharge portion 3 are arranged side by side along the surface of the substrate so as to be adjacent to each other; the drying gas supply portion 28 is provided with the air supply inlet 4 and the air discharge outlets 29, and the gas/liquid mixture discharge portion 3 is provided with the gas/liquid mixture discharge outlets 5. Further, in this embodiment, an air curtain forming portion 37 is arranged on the opposite side of the gas/liquid mixture discharge portion 3 with respect to the drying gas supply portion 28, and two air supply inlets 38 for air curtain are provided on the top surface of the air curtain forming portion 37.

As can be seen from FIG. 12, the construction of the drying gas supply portion 28 and the construction of the gas/liquid mixture discharge portion 3 is completely the same as those of the third embodiment. And, in the air curtain forming portion 37, a porous material 40 is secured to the lower portion of a casing 39 whose lower side is open. The porous material 40 may be the same as the porous material 19 of the gas/liquid mixture discharge portion 18. Further, the drying gas supply portion 28 and the air curtain forming portion 37 are secured to each other by screws 41.

When using the drying nozzle 36 of this embodiment, air is supplied to the air curtain air supply inlets 38 of the air curtain forming portion 37 as well as to the air supply inlets 29 of the drying gas supply portion 28. However, the amount of air supplied to the air curtain air supply inlets 38 need not be so large as that supplied to the air supply inlets 29 of the drying gas supply portion 28. An air curtain is formed on the front side with respect to the direction in which the substrate 10 advances, and air is sprayed against the substrate 10 on the rear side thereof; due to the formation of the air curtain, the flowing of the air sprayed onto the substrate 10 to the air curtain side is restrained, and the liquid more easily flows to the gas/liquid mixture discharge portion side 3 due to the air jet from the air spraying slit 16, whereby an improvement is achieved in terms of efficiency in drying.

Seventh Embodiment

The seventh embodiment of the present invention will now be described with reference to FIGS. 13 and 14.

Figure 13:
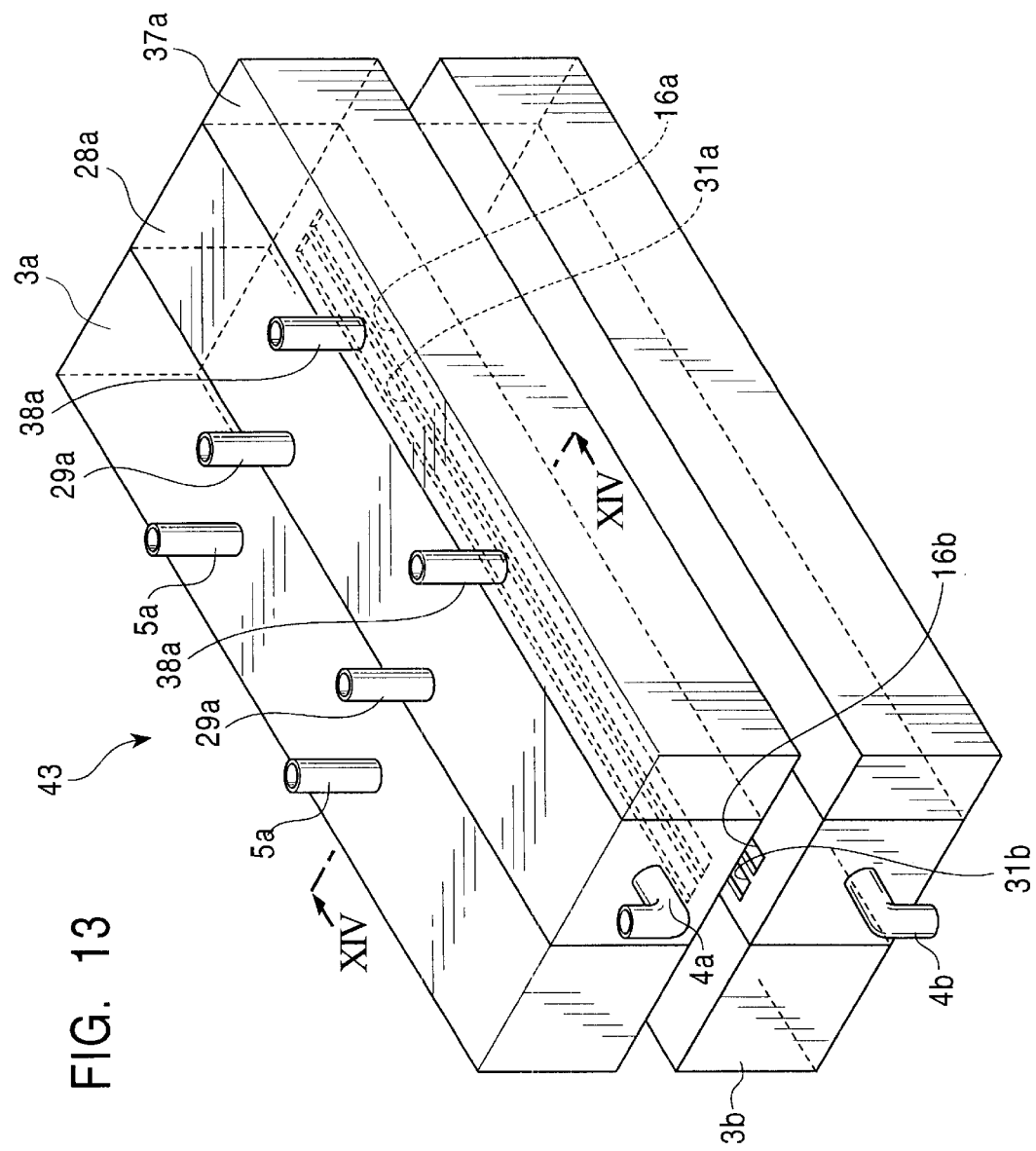
FIG. 13 is a perspective view of a drying nozzle according to a seventh embodiment of the present invention.
Figure 14:
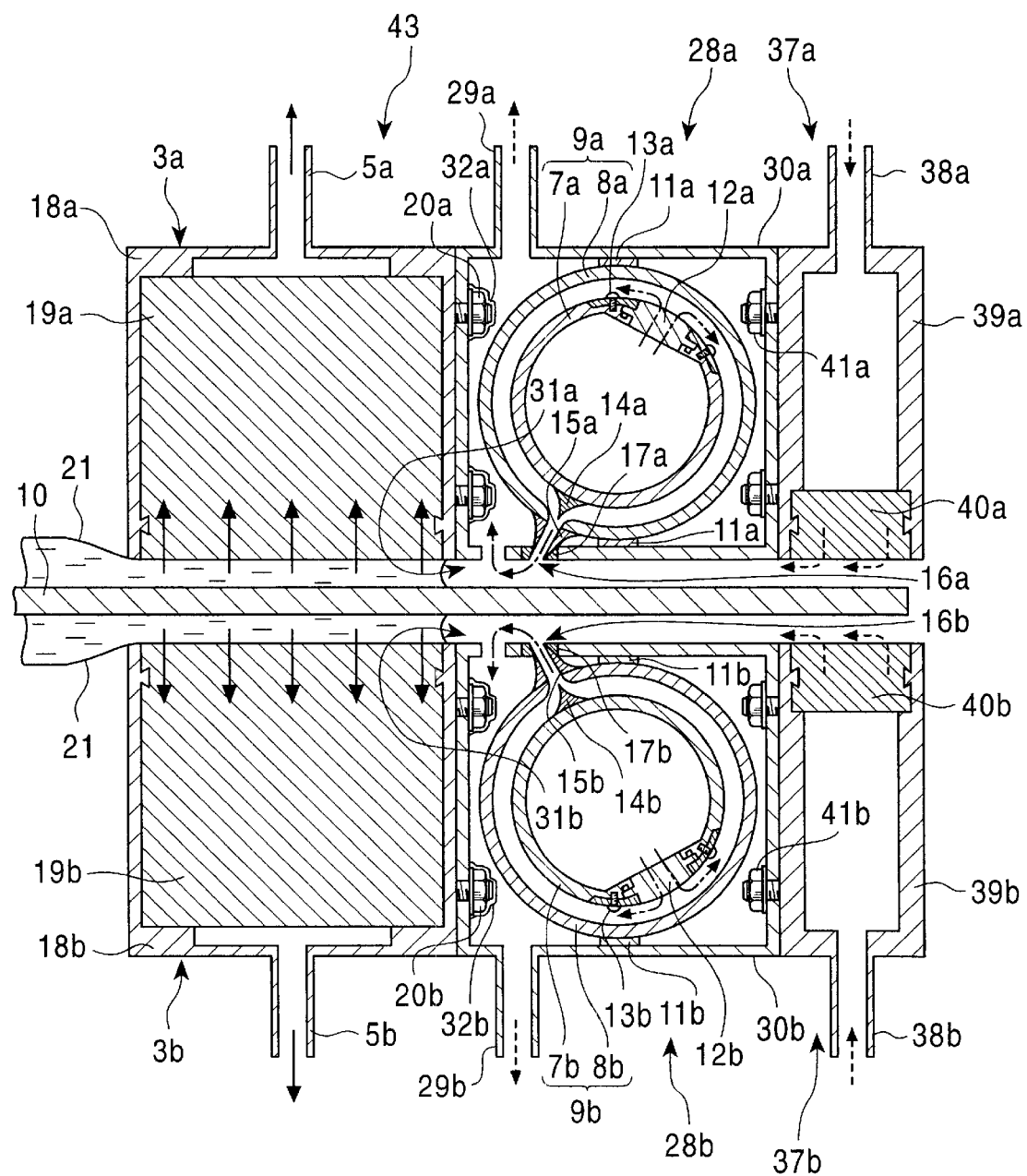
FIG. 14 is a sectional view taken along the line XIV—XIV of FIG. 13.

FIG. 13 is a perspective view showing the drying nozzle of this embodiment, and FIG. 14 is a sectional view taken along the line XIV—XIV of FIG. 13. While the drying nozzle of the sixth embodiment only dries the obverse surface of a substrate, the drying nozzle of this embodiment is capable of simultaneously drying both the obverse and reverse surfaces of a substrate.

As shown in FIGS. 13 and 14, the drying nozzle 43 of this embodiment consists of drying nozzles 36 according to the sixth embodiment arranged in vertical symmetry, and the construction of each component nozzle is completely the same as that of the drying nozzle 36 of the sixth embodiment. Thus, in FIGS. 13 and 14, the components which are common to those of FIGS. 11 and 12 are indicated by the same reference numerals with the affix "a" added thereto for the upper nozzle and the affix "b" added thereto for the lower nozzle, and a description of such components will be omitted. It is possible for the upper and lower nozzles to move independently as separate units or be connected in an arbitrary way so as to move together.

Eighth Embodiment

The eighth embodiment of the present invention will now be described with reference to FIGS. 15 and 16.

Figure 15:
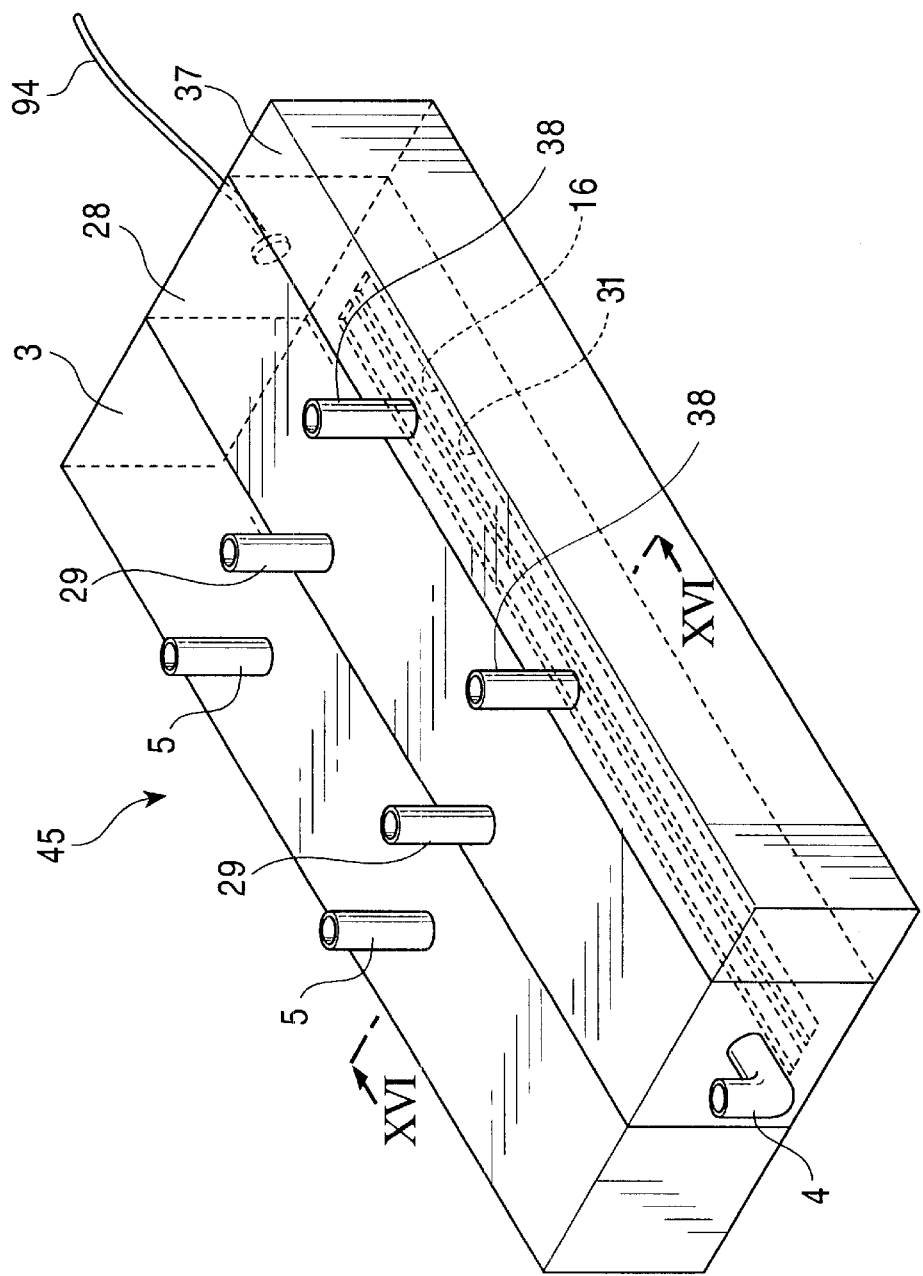
FIG. 15 is a perspective view of a drying nozzle according to an eighth embodiment of the present invention.
Figure 16:
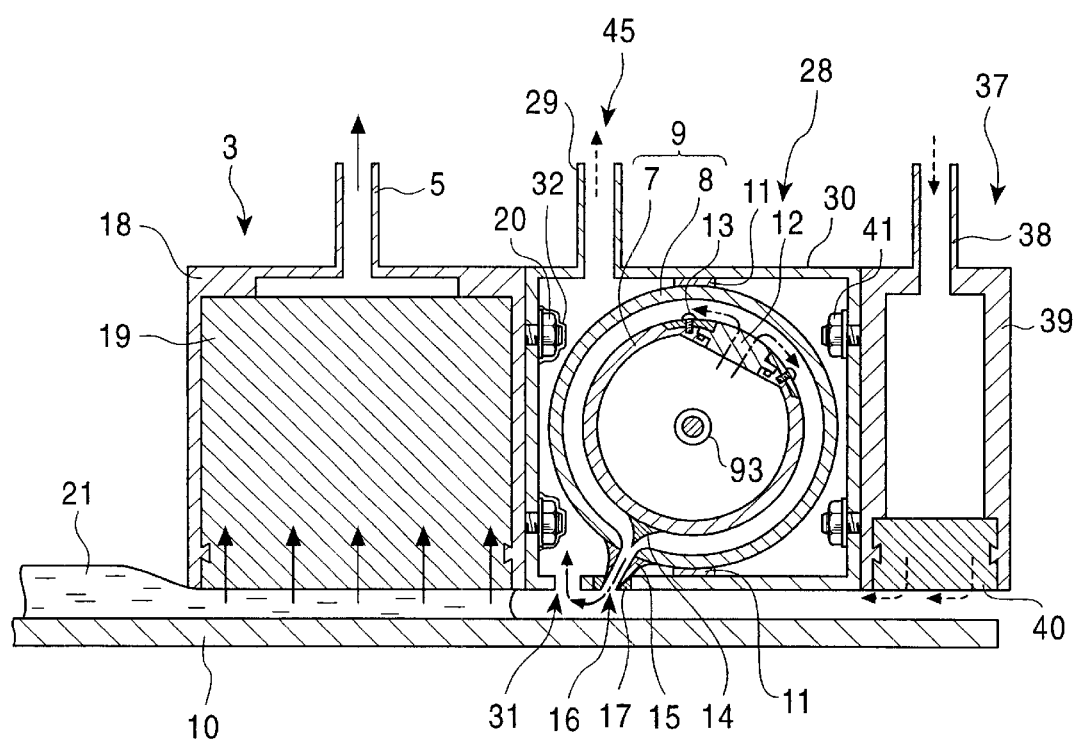
FIG. 16 is a sectional view taken along the line XVI—XVI of FIG. 15.

FIG. 15 is a perspective view showing the drying nozzle of this embodiment, and FIG. 16 is a sectional view taken along the line XVI—XVI of FIG. 15. In the drying nozzle of this embodiment, a heater (heating means) is further added to the drying gas supply portion of the drying nozzle of the sixth embodiment, to which an air curtain is added. Thus, in FIGS. 15 and 16, the components which are common to those of FIGS. 11 and 12 are indicated by the same reference numerals, and a detailed description thereof will be omitted.

As shown in FIG. 16, in the drying nozzle 45 of this embodiment, a heater 93 is arranged inside,the air supply tube 9 of the drying gas supply portion 28. Due to this construction, the air is heated as it flows inside the drying gas supply portion 28, and an whose temperature is higher than that of the air originally introduced in the nozzle is sprayed against the substrate 10. For example, it is desirable for the temperature of the air to be 60 to 80° C. In FIG. 15, numeral 94 indicates a power source line for the heater.

In the drying nozzle 45 of this embodiment, high temperature air is sprayed onto the surface of the substrate 10, so that it is possible to achieve an improvement in drying efficiency.

Ninth Embodiment

The ninth embodiment of the present invention will now be described with reference to FIG. 17.

This embodiment consists of an example of a cleaning device equipped with the drying nozzle of the present invention. FIG. 17 is a diagram schematically showing the construction of the cleaning device 51 of this embodiment, which is a device for cleaning large size glass substrates (hereinafter simply referred to as substrates) of, for example, several hundreds mm square.

In the drawing, numeral 52 indicates a cleaning portion, numeral 53 indicates a stage (substrate holding means), numerals 54, 55, 56 and 49 indicate cleaning nozzles, numeral 50 indicates a drying nozzle, numeral 57 indicates a substrate feeding robot, numeral 58 indicates a loader cassette, numeral 59 indicates an unloader cassette, numeral 60 indicates a hydrogen-water/ozone-water generating portion, numeral 61 indicates a cleaning liquid reproducing portion, and symbol W indicates a substrate.

Figure 17:
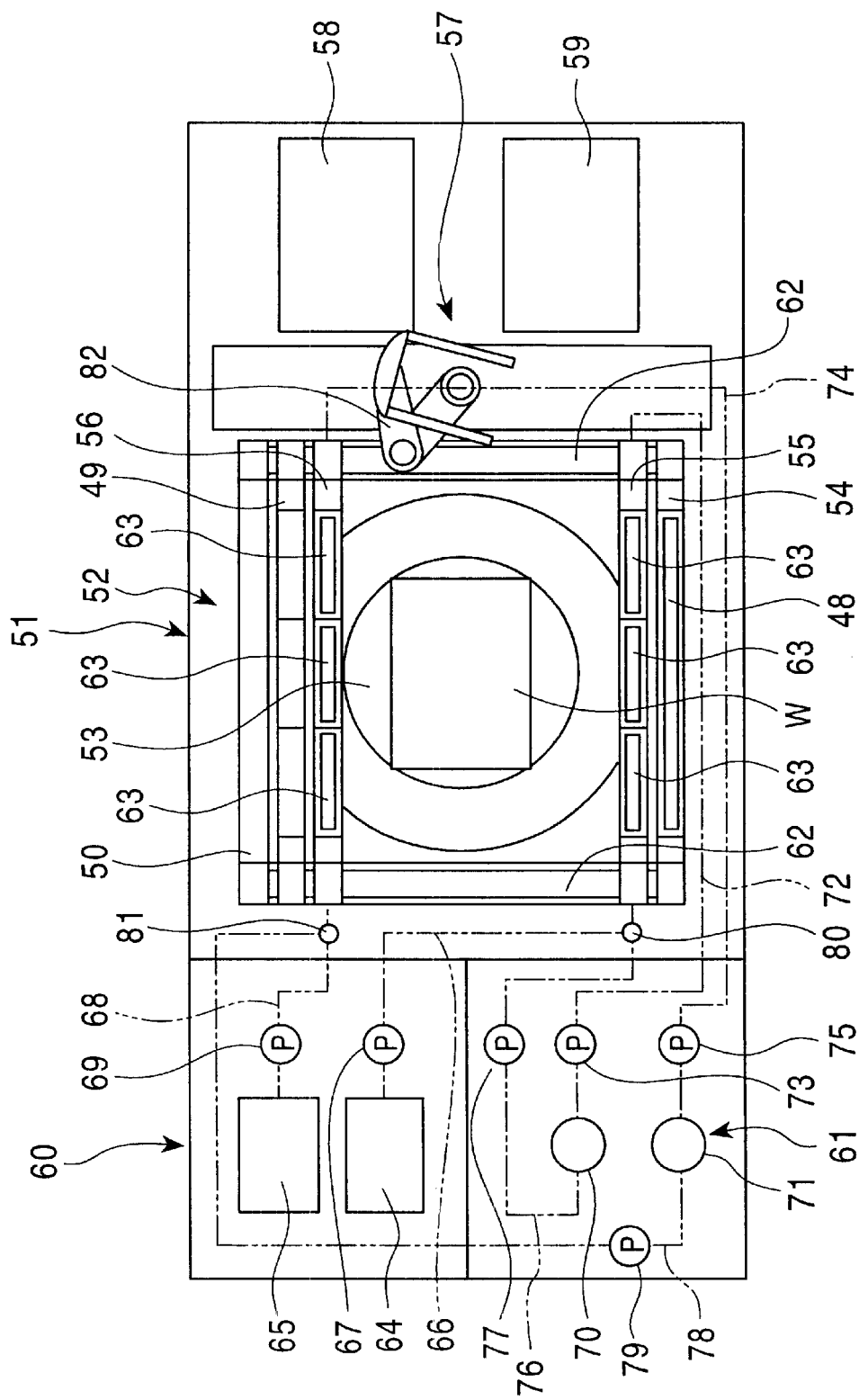
FIG. 17 is a plan view schematically showing a cleaning device according to a ninth embodiment of the present invention.

As shown in FIG. 17, the central portion of the upper surface of the device constitutes the cleaning portion 52, where the stage 53 for holding substrates is provided. Provided in the stage 53 is a rectangular step portion which is in conformity with the configuration of the substrate W, and the substrate W is fitted into this step portion, and held by the stage 53, with the surface of the substrate W being flush with the surface of the stage 53. Formed below the step portion is a space portion, where a substrate raising/lowering shaft protrudes from below the stage 53. Provided at the lower end of the substrate raising/lowering shaft is a shaft drive source such as a cylinder, and the substrate raising/lowering shaft moves vertically by the operation of the cylinder when the substrate W is passed by the substrate feeding robot 57 described below, the substrate W ascending or descending with the vertical movement of the shaft. Further, a nozzle for cleaning the reverse side of the substrate W protrudes from a hole provided at the center of the stage. While in this device the obverse side is mainly cleaned, the reverse side can also be lightly cleaned.

A pair of rack bases 62 are provided on either side of the stage 53 so as to be opposite to each other. Between these rack bases 62, the cleaning nozzles 54, 55, 56 and 49 are provided. The cleaning nozzles consist of four nozzles arranged in parallel, the cleaning nozzles 54, 55, 56 and 49 performing cleaning in different manners. In this embodiment, these four nozzles consist of the ultraviolet ray cleaning nozzle 54, which supplies ozone to the substrate and applies ultraviolet rays to the substrate from an ultraviolet ray lamp 48 to thereby mainly decompose and remove organic substances, the ozone water ultrasonic cleaning nozzle 55, which imparts ultrasonic oscillation by an ultrasonic element 63 while supplying ozone water, the hydrogen water ultrasonic cleaning nozzle 56, which imparts ultrasonic oscillation by an ultrasonic element 63 while supplying ozone water, and the pure water rinse cleaning nozzle 49, which supplies pure water to perform rinse cleaning. These four nozzles sequentially move over the substrate W along the rack bases 62 while maintaining the distance between them and the substrate W constant, whereby the total area of the surface of the substrate W to be cleaned is cleaned by four cleaning methods. Further, a drying nozzle 50 according to one of the above embodiments is provided between the rack bases 62, and the wet substrate W after cleaning is dried by this drying nozzle 50. While in FIG. 17 the drying nozzle 50 is in the form of a single bar, it actually includes the above-described drying gas supply portion, gas/liquid mixture discharge portion, etc.

As the moving means for the nozzles, there are provided sliders, which can move horizontally along linear guides above the rack bases 62, and a strut is provided on the upper surface of each slider, the end portions of the cleaning nozzles 54, 55, 56 and 49 and the drying nozzle 50 being fastened to these struts. Provided on each slider is a drive source such as a motor, each slider traveling on the rack base 62. And, by a control signal;supplied from a control section (not shown) of the device, the motor on each slider is operated, whereby the cleaning nozzles 54, 55, 56 and 49 and the drying nozzle 50 individually perform horizontal movement. Further, each strut is provided with a drive source such as a cylinder (not shown), and the struts make vertical movement, whereby the heights of the cleaning nozzles 54, 55, 56 and 49 and the drying nozzle 50, that is, the distance between each of the cleaning nozzles 54, 55, 56 and 49 and the substrate W and the distance between the drying nozzle 50 and the substrate W can be adjusted.

In each of the cleaning nozzles 54, 55, 56 and 49, there are formed an introduction path having at one end an inlet for introducing cleaning liquid and a discharge path having at one end an outlet for discharging the cleaning liquid after cleaning, and the other end portions of the introduction path and the discharge path cross each other to form an intersection, at which there is provided an opening which is open toward the substrate W, thus constituting a so-called push-pull type nozzle (fluid omission type nozzle). The opening extends in a direction crossing:the direction in which the cleaning nozzles 54, 55, 56 and 49 are arranged in parallel at least in a length not smaller than the width of the substrate W. (In the case of this embodiment, three sets of intersections, each formed by crossing the introduction path and the discharge path, and openings are provided for each cleaning nozzle, the openings of the three sets in total extending in a length not smaller than the width of the substrate W). A pressure reducing pump is used in the pressure control portion on the discharge path side, and this pressure reducing pump controls the cleaning liquid sucking force at the intersection, balancing the pressure of the cleaning liquid in contact with the atmosphere of the opening (including the surface tension of the cleaning liquid and the surface tension of the surface to be cleaned of the substrate W) with the atmospheric pressure. That is, by making the pressure Pw of the cleaning liquid in contact with the atmosphere of the opening (including the surface tension of the cleaning liquid and the surface tension of the surface to be cleaned of the substrate W) nearly equal to the atmospheric pressure Pa, the cleaning liquid supplied to the substrate W through the opening and coming into contact with the substrate W is discharged to the discharge path without being leaked to the exterior of the cleaning nozzle.

That is, the cleaning liquid supplied from the cleaning nozzle onto the substrate W is removed from the substrate W, without coming into contact with any other portion than the portion of the substrate W to which the cleaning liquid is supplied (opening). Further, an ultrasonic element 63 is provided above the intersection so as to be opposite to the substrate W, imparting ultrasonic waves to the cleaning liquid while the substrate W is being cleaned.

Beside the cleaning portion 52, there are provided a hydrogen-water/ozone-water generating portion 60 and a cleaning liquid reproducing portion 61. A hydrogen water producing device 64 and an ozone water producing device 65 are incorporated in the hydrogen-water/ozone-water generating portion 60. Either cleaning liquid can be generated by dissolving hydrogen gas or ozone gas in pure water. And, the hydrogen water generated in the hydrogen water producing device 64 is supplied to the hydrogen water ultrasonic cleaning nozzle 56 by a liquid feeding pump 67 provided in a hydrogen water supply piping 66. Similarly, the ozone water generated in the ozone water producing device 65 is supplied to the ozone water ultrasonic cleaning nozzle 55 by a liquid feeding pump 69 provided in the ozone water supply piping 68. To the pure water rinse cleaning nozzle 49, pure water is supplied from a pure water supply piping (not shown) in the production line.

Further, in the cleaning liquid reproducing portion 61, there are provided filters 70 and 71 for removing particles and foreign matter contained in the cleaning liquid after use. The hydrogen water filter 70 for removing particles in the hydrogen water and the ozone water filter 71 for removing particles in the ozone water are provided as separate systems. That is, the hydrogen water after use discharged from the discharge outlet of the hydrogen water ultrasonic cleaning nozzle 56 is recovered to the hydrogen water filter 70 by a liquid feeding pump 73 provided in the hydrogen water recovery piping 72. Similarly, the ozone water after use discharged from the discharge outlet of the ozone water ultrasonic cleaning nozzle 55 is recovered to the ozone water filter 71 by a liquid feeding pump provided in the ozone water recovery piping 74.

And, the hydrogen water having passed through the hydrogen water filter 70 is supplied to the hydrogen water ultrasonic cleaning nozzle 56 by a liquid feeding pump 77 provided in the reproduced hydrogen water supply piping 76. Similarly, the ozone water having passed through the ozone water filter 71 is supplied to the ozone water ultrasonic cleaning nozzle 55 by a liquid feeding pump 79 provided in the reproduced ozone water supply piping 78. Further, the hydrogen water supply piping 66 and the reproduced hydrogen water supply piping 76 are connected in front of the hydrogen water ultrasonic cleaning nozzle 56, and a valve 80 makes switching possible between the introduction of new hydrogen water to the hydrogen water ultrasonic cleaning nozzle 56 and the introduction of reproduced hydrogen water thereto. Similarly, the ozone water supply piping 68 and the reproduced ozone water supply piping 78 are connected in front of the ozone water ultrasonic cleaning nozzle 55, and a valve 81 makes switching possible between the introduction of new ozone water to the ozone water ultrasonic cleaning nozzle 55 and the introduction of reproduced ozone water thereto. Although particles have been removed from the hydrogen water and the ozone water having passed through the filters 70 and 71, the in-liquid gas concentration has been reduced. Thus, they may be returned to the hydrogen water producing device 64 and the ozone water producing device 65 again to add hydrogen gas and ozone gas thereto.

Beside the cleaning portion 52, a loader cassette 58 and an unloader cassette 59 are detachably provided. The two cassette 58 and 59 are of the same configuration capable of accommodating a plurality of substrates W. Substrates W which have not been cleaned yet are accommodated in the loader cassette 58, and substrates W which have been cleaned are accommodated in the unloader cassette 59. And, at a position between the loader cassette 58 and the unloader cassette 59, there is provided a substrate feeding robot 57. The substrate feeding robot 57 has in its upper portion an arm 82 having an extendable link mechanism; the arm 82 is rotatable and capable of ascending and descending, the substrates W being supported and fed by the forward end portion of the arm 82.

In the cleaning device 51, constructed as described above, the operator sets various cleaning conditions and drying conditions, for example, the distance between the cleaning nozzle 54, 55, 56 or 49 or the drying nozzle 50 and the substrate W, the moving speed of the cleaning nozzle or the drying nozzle, and the flow rate of the cleaning liquid. Otherwise, the operation of each section is controlled by the control portion, operation being performed automatically. Thus, when this cleaning device 51 is used, a substrate W to be cleaned is set in the loader cassette 58, and the operator operates the start switch, whereby the substrate W is conveyed from the loader cassette 58 to the stage 53 by the substrate feeding robot 57, and ultraviolet cleaning, ozone water ultrasonic cleaning, hydrogen water ultrasonic cleaning, rinse cleaning, and drying are conducted sequentially and automatically on the stage 53 by the cleaning nozzles 54, 55, 56 and 49 and an drying nozzle 50. After drying, the substrate is accommodated in the unloader cassette 59 by the substrate feeding robot 57.

In the cleaning device 51 of this embodiment, the four cleaning nozzles 54, 55, 56 and 49 perform cleaning by different cleaning methods: ultraviolet cleaning, ozone water ultrasonic cleaning, hydrogen water ultrasonic cleaning, and rinse cleaning, so that it is possible to perform various types of cleaning with a single cleaning device. Thus, for example, it is possible to remove particles of minute grain size by hydrogen water ultrasonic cleaning and ozone water ultrasonic cleaning, and further, perform finish cleaning washing away the cleaning liquid adhering to the surface of the substrate by rinse cleaning, thus cleaning off various objects to be removed to a sufficient degree. Further, in the cleaning device of this embodiment, there is provided the drying nozzle 50 of the above embodiment, so that it is possible to automatically conduct cleaning and drying in a continuous manner. In particular, during drying, no mist is generated by air spraying as in the conventional drying nozzle, making it possible to reliably perform the drying of the substrate W. And, in the cleaning device 51 of this embodiment, due to the provision of the drying nozzle of the above embodiment, there is no need to provide a drying means of a spin dry system, and it is possible to realize a high-efficiency cleaning device suitable for production lines of various electronic apparatuses, such as semiconductor devices and liquid crystal display panels.

The technical scope of the present invention is not restricted to the above embodiments, and various modifications are possible without departing from the gist of the present invention. For example, while in the above embodiments a double-tube-shaped air supply tube is used as the gas introduction path of the drying gas supply portion, the specific form of the gas introduction path may be arbitrarily selected. Further, while in the above embodiments a porous material is used in the gas/liquid mixture discharge portion, any type of member will do as long as it has a large number of through-holes for discharging the gas/liquid mixture. For example, it may consist of a large number of thin pipes bundled together. The drying gas is not restricted to air. It is possible to use an arbitrary gas, such as nitrogen.

As described in detail above, in the drying nozzle of the present invention, no liquid mist is generated during the spraying of gas as in the conventional drying nozzle, making it possible to reliably perform the drying of the object to be processed. Further, the amount of drying air used can be reduced. Since the amount of gas/liquid mixture remaining on the surface of the object to be processed is small, there is no need to provide a pump of a large draining amount, making it possible to achieve a reduction in the size of the utility equipment of the drying device and an improvement in efficiency. Thus, by adopting the drying nozzle of the present invention, it is possible to realize a drying device and a cleaning device which exhibit high efficiency.

What is claimed is:

1. A drying nozzle comprising a drying gas supply portion having a gas introduction path for supplying to the surface of an object to be processed a drying gas for drying the object by being sprayed against the object whose surface is wet with a liquid, and a gas/liquid mixture discharge portion which is spaced apart from the surface of the object by a predetermined distance to thereby make the thickness of the liquid adhering to the surface of the object prior to the drying constant and which has a large number of through-holes for discharging the gas/liquid mixture consisting of the drying gas and the liquid from the surface of the object, the drying gas supply portion and the gas/liquid mixture discharge portion being arranged along the surface of the object so as to be adjacent to each other.

2. A drying nozzle according to claim 1, wherein at least the portion of the gas/liquid mixture discharge portion which is opposed to the surface of the object to be processed is formed of a hydrophilic material.

3. A drying nozzle according to claim 1, wherein the drying gas supply portion comprises a first member having the gas introduction path, and a second member which is situated nearer to the gas/liquid mixture discharge portion than the first member with respect to the direction along the surface of the object to be processed and which has a large number of through-holes, wherein the drying gas is supplied from both the gas introduction path of the first member and the large number of through-holes of the second member.

4. A drying nozzle according to claim 1, wherein the drying gas supply portion is provided with a gas discharge path for discharging the drying gas sprayed against the object to be processed.

5. A drying nozzle according to claim 1, wherein the drying gas supply portion is provided with a heating means for heating the drying gas.

6. A drying device comprising a drying nozzle as claimed in claim 1, and a suction means connected to the gas/liquid mixture discharge portion of the drying nozzle and adapted to suck the gas/liquid mixture.

7. A cleaning device comprising:
a substrate and a stage comprising a step portion, the step portion holding the substrate;
a shaft positioned below the stage, the shaft raising/lowering the substrate;
a shaft drive source, which moves the shaft vertically;
a plurality of cleaning nozzles, which are arranged side by side opposite to the substrate to be cleaned and which respectively clean the substrate in a plurality of different manners;
a relative movement device that relatively moves the stage and the plurality of cleaning nozzles to clean the area of the surface of the substrate to be cleaned by the relative movement of the stage and the cleaning nozzles; and
drying nozzle positioned opposite to the substrate to be cleaned.

8. A cleaning device according to claim 7, wherein a plurality of cleaning nozzles comprises an ultraviolet ray cleaning nozzle, which supplies ozone to the substrate and applies ultraviolet rays to the substrate to decompose and remove organic substances.

9. A cleaning device according to claim 7, wherein a plurality of cleaning nozzles comprises an ozone water ultrasonic cleaning nozzle, which imparts ultrasonic oscillation by an ultrasonic element while supplying ozone water.

10. A cleaning device according to claim 7, wherein a plurality of cleaning nozzles comprises a hydrogen water ultrasonic cleaning nozzle, which imparts ultrasonic oscillation by an ultrasonic element while supplying hydrogen water.

11. A cleaning device according to claim 7, wherein a plurality of cleaning nozzles comprises a pure water rinse cleaning nozzle, which supplies pure water to perform rinse cleaning.

12. A cleaning device according to claim 7 which is positioned opposite to the substrate to be cleaned and adapted to dry the substrate to be cleaned.

13. A cleaning device according to claim 7, wherein the step portion is rectangular in shape.

14. A drying device according to claim 6, wherein no mist is generated at the time of spraying the air.

* * * * *

UNITED STATES PATENT AND TRADEMARK OFFICE
CERTIFICATE OF CORRECTION

PATENT NO.    : 6,446,358 B1                                                                 Page 1 of 1
DATED         : September 10, 2002
INVENTOR(S)   : Kenichi Mitsumori et al.

It is certified that error appears in the above-identified patent and that said Letters Patent is hereby corrected as shown below:

<u>Title page,</u>
Item [57], ABSTRACT,
Line 13, delete "liquid,from" and substitute -- liquid from -- in its place.

<u>Column 16,</u>
Line 22, insert -- a -- before "drying".

Signed and Sealed this

Twenty-fourth Day of June, 2003

JAMES E. ROGAN
*Director of the United States Patent and Trademark Office*